United States Patent
Ganesan et al.

(10) Patent No.: US 10,204,851 B2
(45) Date of Patent: Feb. 12, 2019

(54) HIGH DENSITY PACKAGE INTERCONNECTS

(71) Applicant: INTEL CORPORATION, Santa Clara, CA (US)

(72) Inventors: Sanka Ganesan, Chandler, AZ (US); Zhiguo Qian, Chandler, AZ (US); Robert L. Sankman, Phoenix, AZ (US); Krishna Srinivasan, Chandler, AZ (US); Zhaohui Zhu, Tempe, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/900,696

(22) Filed: Feb. 20, 2018

(65) Prior Publication Data
US 2018/0182696 A1 Jun. 28, 2018

Related U.S. Application Data

(62) Division of application No. 15/174,921, filed on Jun. 6, 2016, now Pat. No. 9,922,916, which is a division
(Continued)

(51) Int. Cl.
*H01L 23/498* (2006.01)
*H01L 23/00* (2006.01)
(Continued)

(52) U.S. Cl.
CPC .. *H01L 23/49811* (2013.01); *H01L 21/76885* (2013.01); *H01L 23/50* (2013.01);
(Continued)

(58) Field of Classification Search
CPC .............. H01L 21/76885; H01L 23/49811
See application file for complete search history.

(56) References Cited

U.S. PATENT DOCUMENTS

| 4,865,245 A | 9/1989 | Schulte et al. |
| 6,211,576 B1 | 4/2001 | Shimizu et al. |
| (Continued) | | |

FOREIGN PATENT DOCUMENTS

| JP | 63079348 | 4/1988 |
| JP | 2000082716 | 3/2000 |
| (Continued) | | |

OTHER PUBLICATIONS

International Search Report and Written Opinion for International Application No. PCT/US2011/068278, dated Nov. 12, 2012, 12 pp. [77.228PCT (ISR & WO)].
(Continued)

*Primary Examiner* — Christine Enad
(74) *Attorney, Agent, or Firm* — Konrad Raynes Davida & Victor LLP; Alan S. Raynes

(57) ABSTRACT

Electronic assemblies and methods including the formation of interconnect structures are described. In one embodiment an apparatus includes semiconductor die and a first metal bump on the die, the first metal bump including a surface having a first part and a second part. The apparatus also includes a solder resistant coating covering the first part of the surface and leaving the second part of the surface uncovered. Other embodiments are described and claimed.

20 Claims, 8 Drawing Sheets

Related U.S. Application Data of application No. 13/977,658, filed as application No. PCT/US2011/068278 on Dec. 31, 2011, now Pat. No. 9,368,437.

(51) Int. Cl.
  *H01L 23/50* (2006.01)
  *H01L 21/768* (2006.01)
  *H01L 23/538* (2006.01)

(52) U.S. Cl.
  CPC .............. *H01L 24/11* (2013.01); *H01L 24/13* (2013.01); *H01L 24/14* (2013.01); *H01L 24/16* (2013.01); *H01L 24/17* (2013.01); *H01L 24/81* (2013.01); *H01L 23/5386* (2013.01); *H01L 2224/10126* (2013.01); *H01L 2224/1147* (2013.01); *H01L 2224/1182* (2013.01); *H01L 2224/11831* (2013.01); *H01L 2224/11849* (2013.01); *H01L 2224/1301* (2013.01); *H01L 2224/131* (2013.01); *H01L 2224/13013* (2013.01); *H01L 2224/13014* (2013.01); *H01L 2224/1357* (2013.01); *H01L 2224/13082* (2013.01); *H01L 2224/13147* (2013.01); *H01L 2224/13562* (2013.01); *H01L 2224/13687* (2013.01); *H01L 2224/14132* (2013.01); *H01L 2224/14133* (2013.01); *H01L 2224/14135* (2013.01); *H01L 2224/14136* (2013.01); *H01L 2224/16013* (2013.01); *H01L 2224/16014* (2013.01); *H01L 2224/16058* (2013.01); *H01L 2224/16238* (2013.01); *H01L 2224/1703* (2013.01); *H01L 2224/17051* (2013.01); *H01L 2224/81191* (2013.01); *H01L 2224/81203* (2013.01); *H01L 2224/81385* (2013.01); *H01L 2224/81395* (2013.01); *H01L 2224/81411* (2013.01); *H01L 2224/81439* (2013.01); *H01L 2224/81444* (2013.01); *H01L 2224/81447* (2013.01); *H01L 2224/81815* (2013.01); *H01L 2924/05042* (2013.01); *H01L 2924/1434* (2013.01); *H01L 2924/381* (2013.01); *H01L 2924/3841* (2013.01)

(56) References Cited

U.S. PATENT DOCUMENTS

| | | | |
|---|---|---|---|
| 6,392,301 | B1 | 5/2002 | Waizman et al. |
| 6,420,664 | B1 | 7/2002 | Muramatsu et al. |
| 6,430,058 | B1 | 8/2002 | Sankman et al. |
| 6,432,807 | B1 | 8/2002 | Tsukui et al. |
| 6,495,397 | B2 | 12/2002 | Kubota et al. |
| 6,770,547 | B1 | 8/2004 | Inoue et al. |
| 7,279,362 | B2 | 10/2007 | Li et al. |
| 7,638,882 | B2 | 12/2009 | Sankman |
| 7,705,447 | B2 | 4/2010 | Ganesan et al. |
| 7,750,469 | B2 | 7/2010 | Cho et al. |
| 7,897,486 | B2 | 3/2011 | Li et al. |
| 8,035,226 | B1 | 10/2011 | Wilcoxen et al. |
| 8,188,594 | B2 | 5/2012 | Ganesan et al. |
| 8,193,072 | B2 | 6/2012 | Li et al. |
| 8,466,559 | B2 | 6/2013 | Manepalli et al. |
| 8,970,034 | B2 | 3/2015 | Gandhi |
| 9,257,276 | B2 | 2/2016 | Aleksov et al. |
| 9,368,437 | B2 | 6/2016 | Ganesan et al. |
| 9,583,390 | B2 | 2/2017 | Aleksov et al. |
| 9,922,916 | B2 | 3/2018 | Ganesan et al. |
| 2001/0042923 | A1 | 11/2001 | Yanagida |
| 2003/0151140 | A1* | 8/2003 | Nishiyama ............ H01L 21/563 257/737 |
| 2004/0027788 | A1 | 2/2004 | Chiu et al. |
| 2004/0149479 | A1 | 8/2004 | Chiu et al. |
| 2004/0150104 | A1* | 8/2004 | Terui .................. H01L 23/3114 257/734 |
| 2005/0106505 | A1 | 5/2005 | Chiu et al. |
| 2005/0211750 | A1 | 9/2005 | Pearson et al. |
| 2005/0280138 | A1 | 12/2005 | Shrivastava et al. |
| 2006/0038291 | A1 | 2/2006 | Chung et al. |
| 2006/0175686 | A1 | 8/2006 | Murata et al. |
| 2006/0244128 | A1 | 11/2006 | Hayashi et al. |
| 2007/0001317 | A1 | 1/2007 | Matsuoka et al. |
| 2007/0045840 | A1 | 3/2007 | Varnau |
| 2007/0045841 | A1 | 3/2007 | Cho et al. |
| 2007/0138635 | A1 | 6/2007 | Ikumo et al. |
| 2008/0096294 | A1 | 4/2008 | Liu et al. |
| 2008/0290136 | A1* | 11/2008 | Murayama ........... B23K 3/0638 228/8 |
| 2009/0032941 | A1 | 2/2009 | McLellan et al. |
| 2009/0057893 | A1 | 3/2009 | Iwaki |
| 2009/0065931 | A1 | 3/2009 | Rangaraj et al. |
| 2009/0233436 | A1* | 9/2009 | Kim ...................... H01L 24/11 438/614 |
| 2010/0252926 | A1 | 10/2010 | Kato et al. |
| 2011/0074047 | A1* | 3/2011 | Pendse .................. H01L 21/563 257/782 |
| 2011/0095415 | A1 | 4/2011 | Topacio et al. |
| 2011/0101519 | A1 | 5/2011 | Hsiao et al. |
| 2011/0101527 | A1 | 5/2011 | Cheng et al. |
| 2011/0122592 | A1 | 5/2011 | Ganesan et al. |
| 2011/0248399 | A1* | 10/2011 | Pendse .................. H01L 21/563 257/737 |
| 2011/0309490 | A1 | 12/2011 | Lu et al. |
| 2012/0119359 | A1 | 5/2012 | Im et al. |
| 2012/0208321 | A1 | 8/2012 | Foote et al. |
| 2013/0087908 | A1 | 4/2013 | Yu et al. |
| 2014/0217585 | A1 | 8/2014 | Mallik et al. |
| 2016/0155667 | A1 | 6/2016 | Aleksov et al. |
| 2017/0141061 | A1 | 2/2017 | Aleksov et al. |

FOREIGN PATENT DOCUMENTS

| | | |
|---|---|---|
| JP | 2006261641 | 9/2006 |
| KR | 10-2007-0023268 | 2/2007 |

OTHER PUBLICATIONS

International Preliminary Report on Patentability (IPRP) for International Application No. PCT/US2011/068278, dated Jul. 10, 2014, 8 pp. [77.228PCT (IPRP)].

International Search Report and Written Opinion for International Application No. PCT/US2011/068275, dated Jul. 16, 2012, 9 pp. [77.230PCT (ISR & WO)].

International Preliminary Report on Patentability (IPRP) for International Application No. PCT/US2011/068275, dated Jul. 10, 2014, 6 pp. [77.230PCT (IPRP)].

Parylene Engineering web page about Properties (view from internet archive dated Sep. 25, 2010), https://web.archive.org/web/20100925182942/http://www.paryleneengineering.com/properties.html.

Semblant Global Limited web page about Surface Finish (view from internet archive dated Sep. 3, 2011), https://web.archive.org/web/20110903015700/http://www.semblantglobal.com/technology/surface_finish.html.

VP Scientific web page about Parylene (view from internet archive dated Jul. 17, 2011), https://web.archive.org/web/20110717232048/http://www.vp-scientific.com/parylene_properties.htm.

Office Action 1 for U.S. Appl. No. 13/977,658, dated Apr. 16, 2015, 17 pp. [77.228 (OA1)].

Response to Office Action 1 for U.S. Appl. No. 13/977,658, dated Jul. 16, 2015, 17 pp. [77.228 (ROA1)].

Supplemental Response to Office Action 1 for U.S. Appl. No. 13/977,658, dated Sep. 25, 2015, 9 pp. [77.228 (SROA1)].

Notice of Allowance 1 for U.S. Appl. No. 13/977,658, dated Oct. 13, 2015, 16 pp. [77.228 (NOA1)].

Notice of Allowance 2 for U.S. Appl. No. 13/977,658, dated Feb. 11, 2016, 12 pp. [77.228 (NOA2)].

(56) References Cited

OTHER PUBLICATIONS

Office Action 1 for U.S. Appl. No. 13/977,663, dated Feb. 12, 2015, 20 pp. [77.230 (OA1)].
Response to Office Action 1 for U.S. Appl. No. 13/977,663, dated May 12, 2015, 7 pp. [77.230 (ROA1)].
Final Office Action 1 for U.S. Appl. No. 13/977,663, dated May 27, 2015, 13 pp. [77.230 (FOA1)].
Response to Final Office Action 1 for U.S. Appl. No. 13/977,663, dated Aug. 27, 2015, 8 pp. [77.230 (RFOA1)].
Notice of Allowance for U.S. Appl. No. 13/977,663, dated Oct. 1, 2015, 8 pp. [77.230 (NOA1)].
Notice of Allowance for U.S. Appl. No. 15/018,686, dated Oct. 12, 2016, 18 pp. [77.230D1 (NOA1)].
Office Action 1 for U.S. Appl. No. 15/421,340, dated Mar. 29, 2017, 17 pp. [77.230D2 (OA1)].
Response to Office Action 1 for U.S. Appl. No. 15/421,340, dated Jun. 29, 2017, 8 pp. [77230D2 (ROA1)].
Notice of Allowance for U.S. Appl. No. 15/421,340, dated Jul. 14, 2017, 5 pp. [77230D2 (NOA1)].
Office Action 1 for U.S. Appl. No. 15/174,921, dated Mar. 24, 2017, 21 pp. [77.228D1 (OA1)].
Response to Office Action 1 for U.S. Appl. No. 15/174,921, dated Jun. 25, 2017, 10 pp. [77228D1 (ROA1)].
Notice of Allowance for U.S. Appl. No. 15/174,921, dated Oct. 27, 2017, 9 pp. [77.228D1 (NOA1)].

\* cited by examiner

HIGH DENSITY PACKAGE INTERCONNECTS

BACKGROUND

With the ever increasing feature growth and performance in each integrated circuit device generation, there is a need to correspondingly shrink the feature sizes of integrated circuit die interconnects and package substrate to provide higher performance in cost-optimized die sizes. This scaling phenomenon leads to the use of complex design layouts and manufacturing techniques in order to form reliable interconnect structures having suitable electrical and mechanical properties. It has proven difficult to continue to shrink the feature size of the interconnect structures while forming a reliable solder connection between the die and substrate.

BRIEF DESCRIPTION OF THE DRAWINGS

Embodiments are described by way of example, with reference to the accompanying drawings, which are not drawn to scale.

FIG. 6A includes all circular pads. FIG. 6B includes a combination of circular pads and rectangular pads, in accordance with certain embodiments.

FIG. 8A illustrates a configuration on a substrate including a stripline escape pattern, in accordance with certain embodiments. FIG. 8B illustrates a configuration on a substrate including a microstrip escape pattern, in accordance with certain embodiments.

FIG. 10A is a flowchart of operations for forming a solder connection in an I/O signal region, in accordance with certain embodiments. FIG. 10B is a flowchart of operations for forming a solder connection in a core power or I/O power region, in accordance with certain embodiments.

DETAILED DESCRIPTION

Reference below will be made to the drawings wherein like structures may be provided with like reference designations. In order to show the structures of various embodiments most clearly, the drawings included herein include diagrammatic representations of electronic device and integrated circuit structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Certain embodiments relate the formation of interconnect architectures that enable high input/output escape density and reduced interlayer dielectric stress in a die structure. Embodiments include a number of features. One feature of certain embodiments relates to the control of the relationship between the size of the die structure copper bump-solder wetted interface to the size of the package substrate pad, for connections including input/output (I/O) signal regions, and for core power and I/O power regions. Another feature of certain embodiments relates to the size of the Cu pad in the I/O signal region and in the core power and I/O power regions. Another feature of certain embodiments relates to the formation of a solder resistant coating on a portion of the copper bump on the die structure. Still another feature of certain embodiments relates to covering the package substrate pads and traces under the die with a thin surface finish layer. Still another feature of certain embodiments relates to controlling the positioning of solder resist on the package substrate so that no solder resist is present under the die and a distance outward from the die shadow. Certain embodiments may include the formation of a full array of high density die to package interconnects.

In accordance with certain embodiments, architectural features in different regions, such as the I/O signal region, the core power region, and the I/O power region, may have different sizes. In certain embodiments, the shapes and sizes within one region, such as within the I/O signal region, may vary in different locations. This may occur for a variety of reasons, including, but not limited to, the routing geometry, the density needs, the control of stresses, and the power needs in the different regions.

Figure 1:
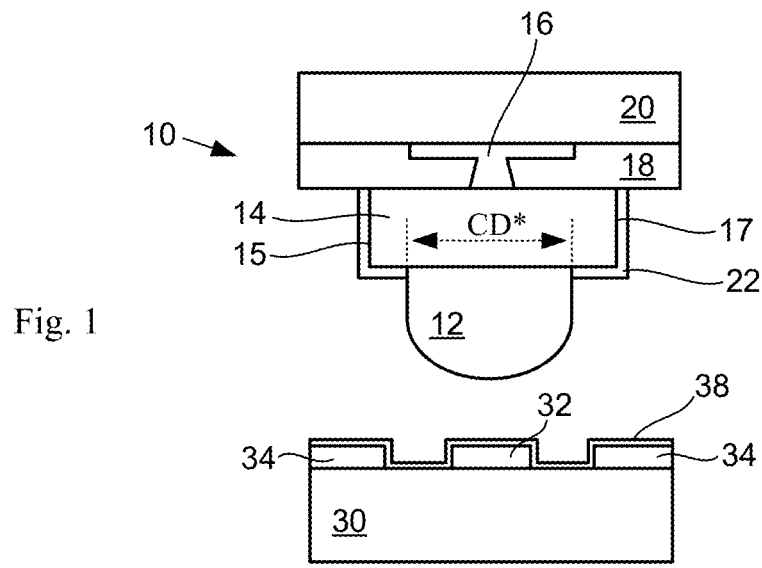
FIG. 1 illustrates a cross-sectional view of an interconnect structure in an input/output (I/O) signal region of a die structure positioned adjacent to a pad region on a package substrate, in accordance with certain embodiments.

FIG. 1 illustrates a cross-sectional view of an assembly including an interconnect structure in an I/O signal region of a die structure 10 positioned adjacent to a pad region on a package substrate 30, in accordance with certain embodiments. The die structure 10 includes a solder bump 12 positioned on a metal bump such as a copper (Cu) bump 14 electrically coupled to the metal interconnect region 16 extending through dielectric layer 18 positioned on layer 20, which may comprise one or more layers including, but not necessarily limited to, a semiconductor die or semiconductor layers, dielectric layers, and metal layers. The Cu bump 14 includes a solder-resistant coating 22 that inhibits the wetting of solder, to control the size of the solder bump 12 formed after reflow. The package substrate 30 as illustrated in FIG. 1 includes a substrate pad 32 adapted to receive the solder bump 12 from the die structure 10 and form a solder connection therethrough. In certain embodiments the pad 32 is sized to accept a C4 solder bump. The package substrate 30 as illustrated in FIG. 1 also includes traces 34 adjacent to the pad 32. The traces 34 may in certain embodiments have the same width as the pad 32 (and thus may be used as a pad) or may have a different width than the pad 32. For example, in certain embodiments, the pad 32 may have a width of about 13 µm and the traces 34 may have a width of about 8 µm.

The package substrate 30 may also include a very thin surface finish layer 38 on the pad 32 and traces 34. In certain embodiments, the surface finish layer 38 is less than 200 nm thick and may be formed from materials including, but not limited to, OSP (Organic Solderability Preservative), Au (gold), Ag (silver), and Sn (tin). In certain embodiments, a thin surface finish layer such as layer 38 may be formed on all exposed metal (e.g., Cu) surfaces on the substrate. The surface finish layer 38 is thin enough that it can be soldered through during the process of attaching the die structure 10 to the package substrate 30. In certain embodiments, the surface finish layer is formed to a thickness of about 100 nm.

In one aspect of certain embodiments, the width of the interface of the solder bump 12 and Cu bump 14 is controlled to ensure that a high density and reliable interconnect structure can be made. If the solder bump 12 extends along the entire width of the Cu bump 14 and up the sidewalls 15, 17 of the Cu bump 14, it may be more difficult to make a reliable solder interconnection. In addition, as the spacing between adjacent solder connections decreases, the risk of solder bridging between solder connections and/or solder bridging to an adjacent trace on the substrate (causing electrical shorting) increases. One way to control the width of the interface is to coat a portion of the Cu bump 14 with a solder resistant material that inhibits the wetting of solder to keep the solder from spreading along the various surfaces of the Cu bump 14. Si nitride deposited to a thickness of about 200 nm is an example of such a solder resistant coating material. Other suitable materials may also be used.

In certain embodiments, it has been found that to form a dense and reliable die to package interconnect in the I/O signal region, the width of the interface of the solder bump 12 and the Cu bump 14 for at least some of the interconnects should be greater than the width of the substrate pad 32 to which the solder bump 12 is coupled. In certain embodiments, such a relationship between solder bump 12 to Cu bump 14 interface and the width of the substrate pad 32 is particularly suitable when a relatively small substrate pad width and a small spacing between substrate pads is used, to ensure that a satisfactory solder bond can be made while at the same time controlling the width of the solder bond to minimize the occurrence of bridging between adjacent solder connections and between a solder connection and an adjacent substrate trace.

The width of the interface of the solder bump 12 and the Cu bump 14 defines a minimum dimension CD* (as indicated by the dotted line arrow in FIG. 1) that provides a die to package interconnect to be bonded directly to a substrate pad 32 to form a reliable connection. To form the reliable interconnection, as noted above, it is beneficial to inhibit the solder from wetting and spreading along the entire width of the Cu bump 14 and the Cu bump vertical walls 15, 17. It should be noted that there are a number of reasons why it may be advantageous to have a relatively large Cu bump 14 width while having a smaller solder interface CD* formed on the Cu bump 14. First, a smaller solder interface may provide the ability to have a tighter pitch on the substrate. Second, the presence of a larger sized Cu bump 14 may provide improved mechanical properties over a die having smaller Cu bumps 14 because the Cu may act to absorb some of the stresses that would otherwise be transmitted into the dielectric layer 18. In addition, having a larger Cu bump 14 generally enables better maximum current carrying capability to the die structure 10. The solder wetted area on the Cu bump 14 may have any desired shape, including, but not limited to, rectangular, circular, or oval shaped when viewed from above. If the solder wetted area is circular in shape, the CD* is the diameter of the solder wetted area interface.

In certain embodiments, the CD* may be determined based on the size of the pad on the substrate to be coupled to, and the tolerances including the chip placement tolerance, the substrate trace and pad width tolerance, and substrate trace and pad thickness tolerance, and the formed solder profile. Such tolerances may vary depending on the processing operations used. Embodiments may utilize any suitable solder attachment process for forming the die to substrate solder connection, including, but not limited to, thermal compression bonding. In an I/O signal region, in certain embodiments where thermal compression bonding is used, the CD* has been found to be equal to the substrate pad width plus two times a value, the value determined from the substrate pad to substrate trace spacing minus a tolerance factor equal to about 9 μm±1 μm. Table 1 below includes architectural information including pitches and dimensions for I/O signal regions and core and I/O power regions, including CD* values for regions having a different I/O signal pitch along an edge of a substrate. For example, as set forth in Table 1, in an embodiment including approximately 37 I/O signal lines per millimeter and a pad width of 13 μm, a CD* having a width of 21 μm was determined. This means that for the substrate pad width of 13 μm, the width of the solder to Cu bump interface should be a minimum of 21 μm to ensure the formation of a reliable solder connection between the Cu bump and the substrate pad in an I/O signal region. Architectural information for other embodiments, including an embodiment including approximately 47 I/O signal lines per mm and a pad width of 13 μm, and another embodiment including core power or I/O power connections having a 66 μm substrate pad width, are also provided in Table 1. It should be noted that where a bump or pad is circular in shape, its width is equal to its diameter.

TABLE 1

Architecture dimensions for I/O signal regions and power regions.

| Region | ~47 I/O signal per mm | ~37 I/O signal per mm | Core Power & I/O Power |
|---|---|---|---|
| Bump pitch | 45 μm (2 row deep) | 55 μm (2 row deep) | 90-130 μm |
| Bump pitch | 85 μm (4 row deep) | 107 μm (4 row deep) | |
| Bump width | 25-30 μm (2 row deep) | 35-40 μm (2 row deep) | 70-100 μm |
| Bump width | 60-70 μm (4 row deep) | 80-90 μm (4 row deep) | |
| CD* | 20 μm (2 row deep) | 21 μm (2 row deep) | 40-89 μm |
| CD* | 20 × (45-65) μm (4 row deep) | 21 × (45-84) μm (4 row deep) | |
| Cu bump ht. | 18.5 μm | 18.5 μm | 18.5 μm |
| Solder ht. | 25 μm | 25 μm | 25 μm |
| Pad width | 13 × (45-74) μm | 13 × (45-84) μm | 66-89 μm |

TABLE 1-continued

Architecture dimensions for I/O signal regions and power regions.

| Region | ~47 I/O signal per mm | ~37 I/O signal per mm | Core Power & I/O Power |
| --- | --- | --- | --- |
| Pad thickness | 15 μm | 15 μm | 15 μm |
| Line pitch | 20 μm | 27 μm | N/A |
| Line thickness | 15 μm | 15 μm | N/A |

Figure 2:
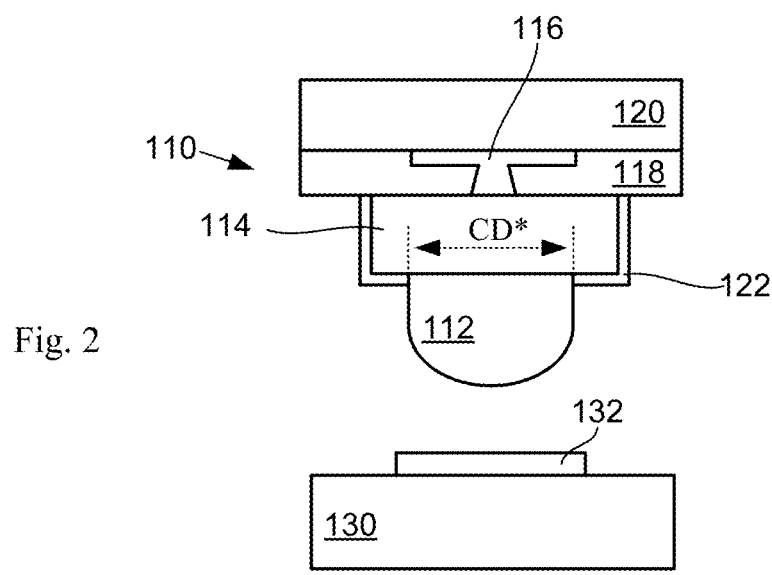
FIG. 2 illustrates a cross-sectional view of an interconnect structure in an I/O power or core power region of a die structure positioned adjacent to a pad region on a package substrate, in accordance with certain embodiments.

FIG. 2 illustrates a cross-sectional view of an assembly including of an interconnect structure in a core power or I/O power region of a die structure 110 positioned adjacent to a pad 132 on a package substrate 130, in accordance with certain embodiments. The structure is similar to that of FIG. 1, with the solder bump 112 positioned on a Cu bump 114 electrically coupled to the metal interconnect region 116 extending through dielectric layer 118 positioned on the layer 120, which may comprise one or more layers including, but not necessarily limited to, a semiconductor die or semiconductor layers, dielectric layers, and metal layers. In the embodiment illustrated in FIG. 2, the Cu bump 114, the solder bump 112, and the substrate pad 132 may be sized differently than those described above in connection with the I/O signal region described in connection with FIG. 1. The Cu bump 114 includes a solder-resistant coating 122 (like the coating 22 described above) that inhibits the wetting of solder, to control the size of the solder bump 112 formed after reflow.

In certain embodiments, it has been found that in the I/O power and the core power regions, such as illustrated in FIG. 2, the CD*, the width of the interface of the solder bump 112 and the Cu bump 114, should be not greater than the width of the substrate pad 32 to which the solder bump 12 will be coupled, to minimize interlayer dielectric (ILD) stress and to optimize electromigration resistance (IMAX). In these power regions, both the Cu bump on the die structure and the substrate pads are typically relatively large, so a reliable solder joint is relatively easy to obtain. As seen in FIG. 2, the CD* the width of the solder bump 112 interface with the Cu bump 114, is less than the width of the substrate pad 132.

Figure 3A:
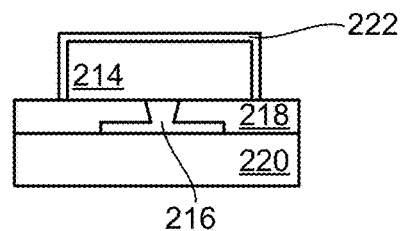
FIGS. 3A-3E illustrate cross-sectional views of operations in the formation of a solder resistant coating over a portion of a metal bump on a die, in accordance with certain embodiments.

As noted above, one method to control the width of the interface between the Cu bump and the solder is to form a coating on the Cu bump. FIGS. 3A-3E illustrate operations in the formation of such a coating. FIG. 3A illustrates a cross-sectional view of a die structure including a Cu bump 214 electrically coupled through metal interconnect region 216 extending through dielectric layer 218 positioned on layer 220, which may comprise one or more layers including, but not necessarily limited to, dielectric, metal, and semiconductor layers. The Cu bump 214 includes a solder-resistant coating 222 positioned thereon. The solder resistant coating 222 may be formed from any suitable material, for example, SiN.

Figure 3B:
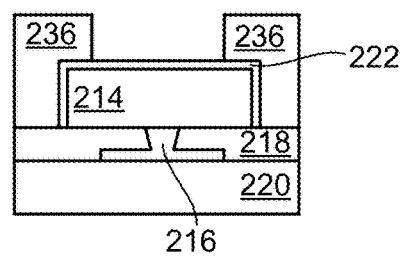
Figure 3C:
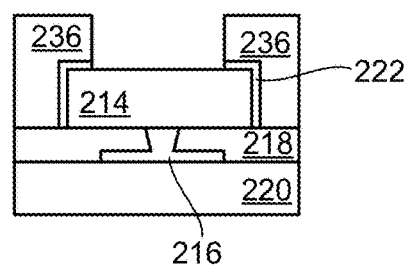
Figure 3D:
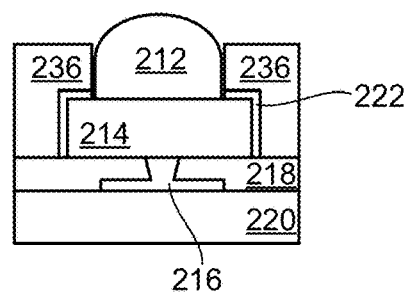
Figure 3E:
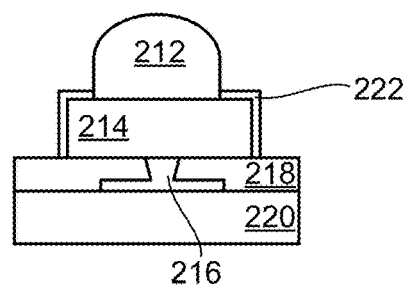

FIG. 3B illustrates a cross-sectional view of a patterned photoresist layer 236 formed on the Cu bump 214 and on the dielectric layer 218 adjacent to the Cu bump 214. As illustrated in FIG. 3C, the photoresist layer 236 is processed to expose a central portion of the Cu bump 214 and the underlying solder resistant coating 222 is also removed in the central portion of the bump 214 using any suitable method. If the solder resistant coating 222 is SiN, then a nitride etch operation may be used to remove the coating 222 from the central portion of the bump 214. As illustrated in FIG. 3D, solder may be delivered to the exposed region on the Cu bump 214 (for example, using a suitable solder paste print operation) and reflowed to form solder bump 212. The photoresist layer 236 remaining may then be stripped, yielding the structure illustrated in FIG. 3E, which includes a Cu bump 214 having a solder bump 212 in a central region thereof, and a solder resistant coated region 222 positioned outside of the solder bump 212 on the surface of the Cu bump 214 and on the sidewalls of the Cu bump 214. Such a structure enables careful control of the size of the solder bump 212 formed on the Cu bump 214.

Embodiments also include the formation of solder connections having different morphologies, including, but not limited to, circular, elliptical, oval, rectangular, and triangular shaped bumps.

Figure 4:
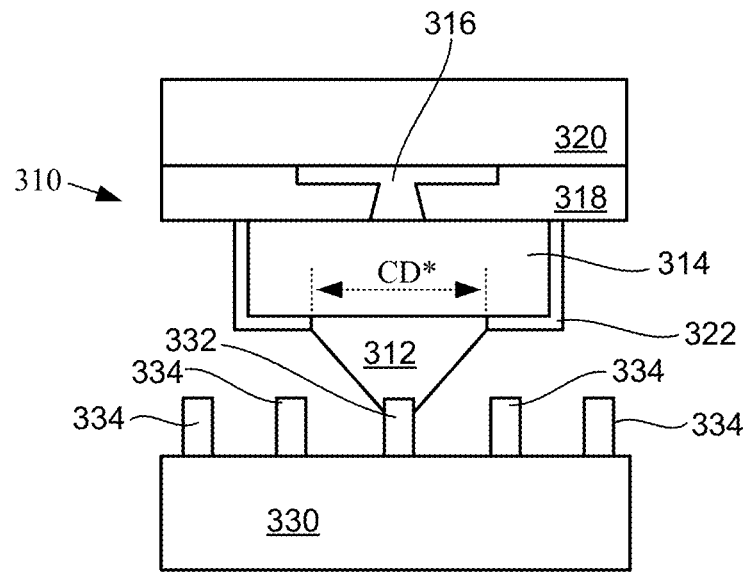
FIG. 4 illustrates a cross-sectional view of an interconnect structure connecting an I/O signal region of a die to a substrate through a solder connection, in accordance with certain embodiments.

FIG. 4 illustrates a cross-sectional view of an interconnect structure in a I/O signal region of a die structure 310 coupled to a substrate 330 through solder connection 312, in accordance with certain embodiments. The die structure 310 includes a solder connection 312 between a Cu bump 314 electrically coupled to the metal interconnect region 316 extending through dielectric layer 318 positioned on layer 320, which may comprise one or more layers including, but not necessarily limited to, a semiconductor die or semiconductor layers, dielectric layers, and metal layers. The Cu bump 314 includes a solder-resistant coating 322 to control the size of the solder connection 312 formed after reflow. The package substrate 330 as illustrated in FIG. 4 includes a pad 332 to which the solder connection 312 is made. As noted above, in certain embodiments, in an I/O signal region, it is preferred to have a CD* width dimension of the solder connection 312 to Cu bump 314 interface be greater than that of the substrate pad width for at least some of the pads, in particular, those pads having a relatively small width. FIG. 4 illustrates such a configuration, in which the width of the interface (CD*) of the solder connection 312 and Cu bump 314 (controlled by the solder-resistant coating 322) is greater than the width of the substrate pad 332. In such embodiments, the solder connection may have a substantially triangular shape in cross-section, as illustrated in FIG. 4.

Figure 5:
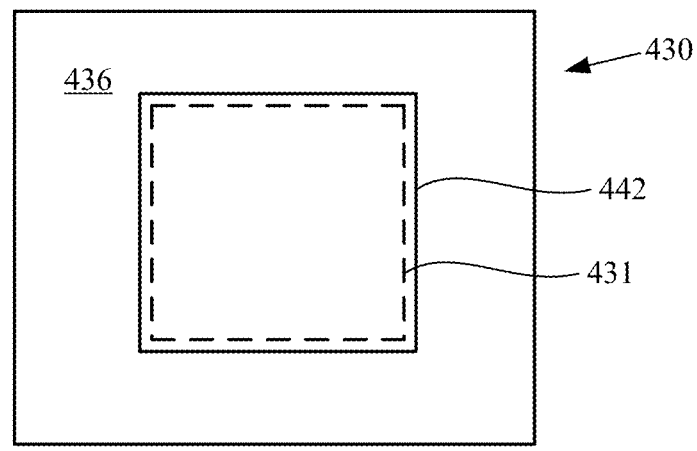
FIG. 5 illustrates a package substrate with a die attach region having no photoresist positioned therein, in accordance with certain embodiments.

FIG. 5 illustrates a view of a package substrate 430 with a die attach region or die shadow 431 bounded by dashed lines. The die shadow 431 (also known as die footprint) is the region on the package substrate 430 that is covered by the die when viewed from above. Certain embodiments include package substrate 430 being formed without solder resist 436 under the die shadow 431. Instead, any solder resist 436 is positioned outside of a region 442 about 0.5 to 2 mm outside of the die shadow 431 on the substrate 430.

Figure 6A:
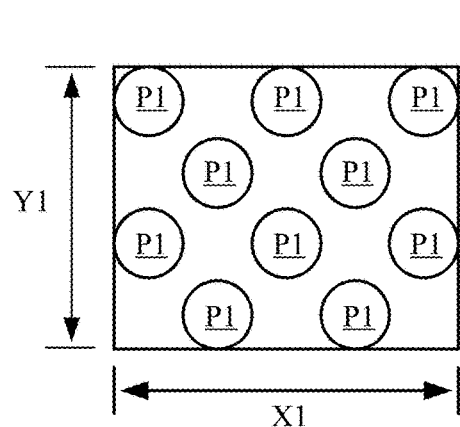
FIGS. 6A and 6B illustrate a comparison of pad regions on a substrate.
Figure 6B:
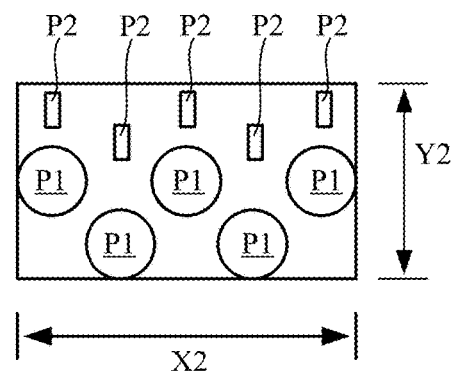

Certain embodiments permit the use of variable size and shape bumps and pads on the die structure and on the package substrate. Certain regions may be one size and shape, and other regions having the same or different signal needs, power needs, or routing needs may be a different size and shape. FIG. 6A illustrates a four row deep pattern of pads P1 on a substrate surface for use in a C4 connection scheme. The pads P1 are of uniform shape and size. FIG. 6B illustrates an embodiment including a variable pad size and shape for a four row deep pattern of pads P1, P2. The first two rows of pads are rectangular pads P2 and the second two rows are circular pads P1. The rectangular pads P2 are substantially smaller in dimension than the circular pads P1 and can be positioned in a tighter pitch. The length X1 in FIG. 6A is equal to the length X2 in FIG. 6B. However, the length Y1 in FIG. 6A is substantially greater than the length Y2 in FIG. 6B. As a result, the same number of pads (e.g., I/O signal) can be placed in less area on the surface of the substrate in the embodiment illustrated in FIG. 6B.

Figure 7:
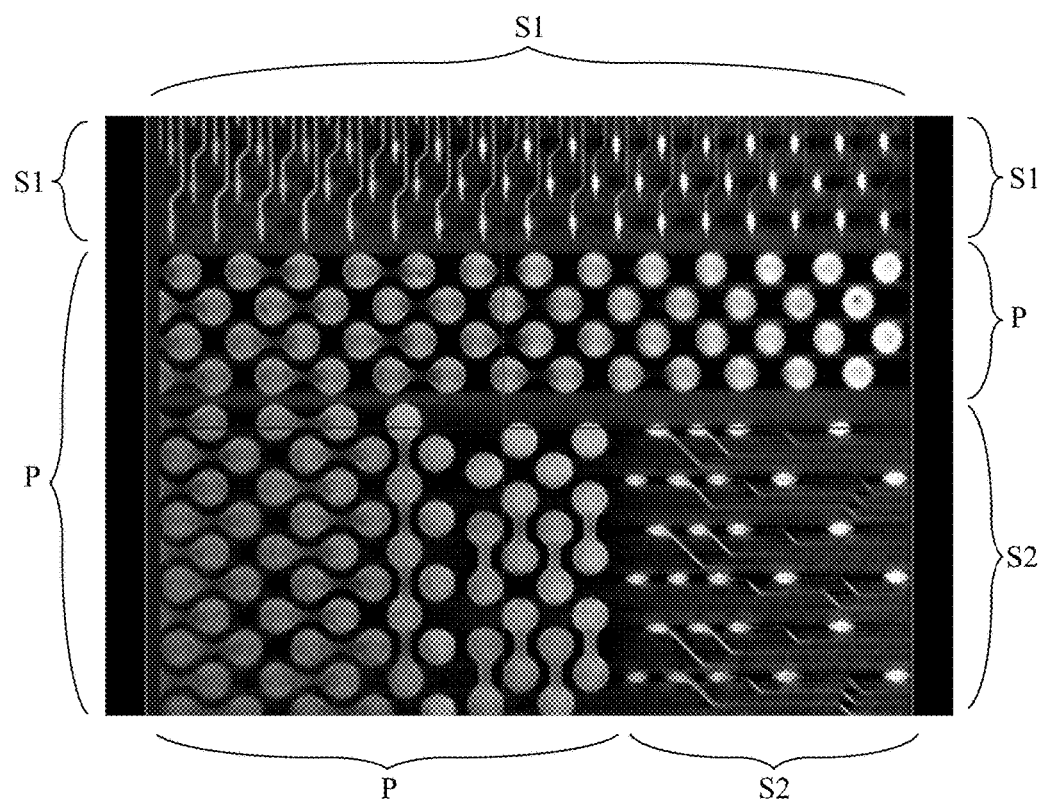
FIG. 7 illustrates a view of solder connections having a plurality of different sizes and geometries, in accordance with certain embodiments.

FIG. 7 illustrates an x-ray image of a portion of a test assembly formed in accordance with certain embodiments, showing the solder connections between a die and substrate. The connections include a variety of different shaped solder connections on a variety of different shaped pads. As indicated by regions delineated by brackets in FIG. 7, region S1 at an upper portion of FIG. 7 shows an input/output signal pattern of solder connections made on small rectangular pads on the substrate. The wire traces leading from the pads can also be seen. The bracketed regions P below the region S1 include I/O power or core power solder connections made on larger circular substrate pads. The region S2 located in the lower right quadrant of FIG. 7 shows another input/output signal pattern of solder connections made on rectangular pads on the substrate. The S1 region (I/O signal) solder connections are substantially smaller than the P region solder connections and as a result, the pitch in the S1 region is smaller than the pitch in the P region. As can be seen in FIG. 7, the shape of the solder connection may vary from the shape of the pads, and may, for example, take a variety of shapes such as elliptical when viewed from above. Embodiments are not limited to the solder connection shapes and sizes illustrated in FIG. 7, and may include a variety of combinations of solder connection shapes and sizes.

The use of smaller solder connections and pads also enables a wide variety of trace patterns to be utilized. The added space on surface due to the smaller size of the solder connection and the smaller pad size leaves room to route traces on the surface of the substrate that may not be possible when larger connections and pads, such as the I/O power connections and pads in portion P2, are used.

Figure 8A:
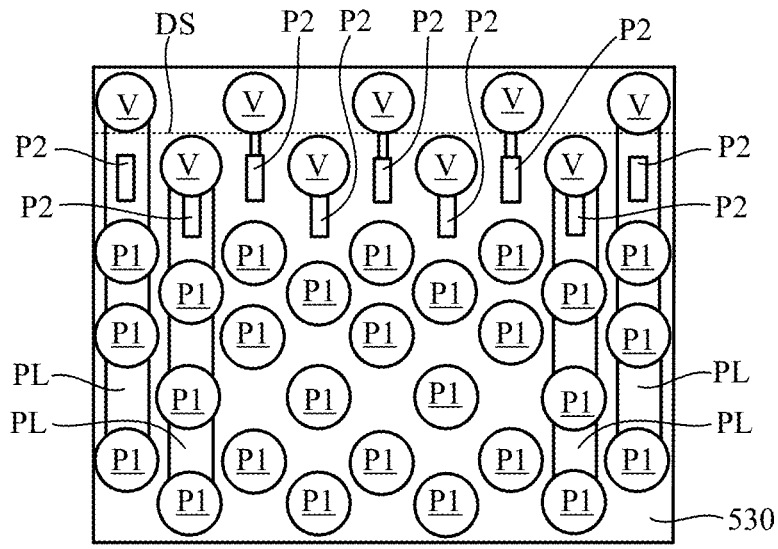
FIGS. 8A and 8B illustrate memory escape configurations.
Figure 8B:
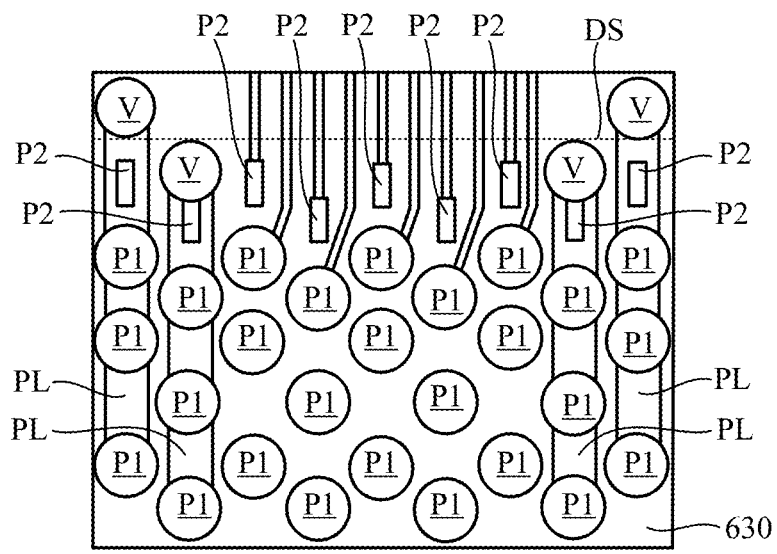

FIGS. 8A and 8B illustrate embodiments including memory region escape patterns on a substrate including regions of stripline escape in FIG. 8A and microstrip escape in FIG. 8B.

FIG. 8A illustrates a back to back two channel DDR configuration including a stripline escape pattern on a substrate 530, where the pads in the first and second channel regions are coupled to vias that transmit the signals to a lower level of the substrate. The first channel is positioned near the top of the FIG. 8A and includes two rows of relatively small rectangular pads P2 and two rows of larger circular pads P1, when viewed from above. Solder contacts from a die positioned above the substrate are made to the pads P1 and P2. The rectangular pads P2 are electrically coupled to microvias V that extend to lower layers of the substrate 530. The circular pads P1 may be formed as microvia pads, where the via is directly under the pad and extends to lower layers of the substrate 530. One row of the microvias V electrically coupled to the first row of the rectangular pads P2 is positioned near a substrate 530 edge, outside of the die shadow DS (dotted line corresponding to the position where an outer edge of a die is positioned over the substrate). The second channel includes four rows of the larger circular pads P1. To the sides of the channels are I/O power lines PL, which also contain some of the pads P1 and P2. In certain embodiments the rectangular pads P2 may be about 13 µm wide by 45 µm long, and the circular pads P1 may be about 66 µm in diameter. Other sizes and shapes of pads (including, but not limited to, elliptical or oval shaped pads) may also be used.

FIG. 8B illustrates a back to back two channel DDR configuration including a microstrip escape pattern on a substrate 630, where some of the pads are electrically coupled to traces that extend along the surface to an edge of the substrate 630. The first channel includes both rectangular shaped pads P2 and circular shaped pads 91 on the substrate. As in the embodiment illustrated in FIG. 8A, the rectangular pads may be about 13 µm wide by 45 µm long, and the circular pads may be about 66 µm in diameter. The first three rows in the first channel of the memory I/O signal pads P2 all have wiring traces that extend beyond the die shadow and extend towards an edge of the substrate. As illustrated in FIG. 8B, the first three rows of the first channel include two rows of rectangular pads and one row of circular pads. The last row in the first channel and the second channel include larger, circular shaped pads P1 that are formed as microvia pads (pad directly over via). To the sides of the channels are I/O power lines PL, which also contain some of the pads P1 and P2. It will be understood that the exact routing and number of microstrip connections versus microvia connections may be varied in different embodiments.

Both the stripline configuration illustrated in FIG. 8A and the microstrip configuration illustrated in FIG. 8B offer advantages over conventional escape patterns. For example, the use of the smaller, rectangular shaped pads permits closer spacing and a tighter pitch between solder contacts. The smaller pads also permit a variety of different routing configurations to be possible due to the added space and different pad geometry on the substrate surface.

Figure 9:
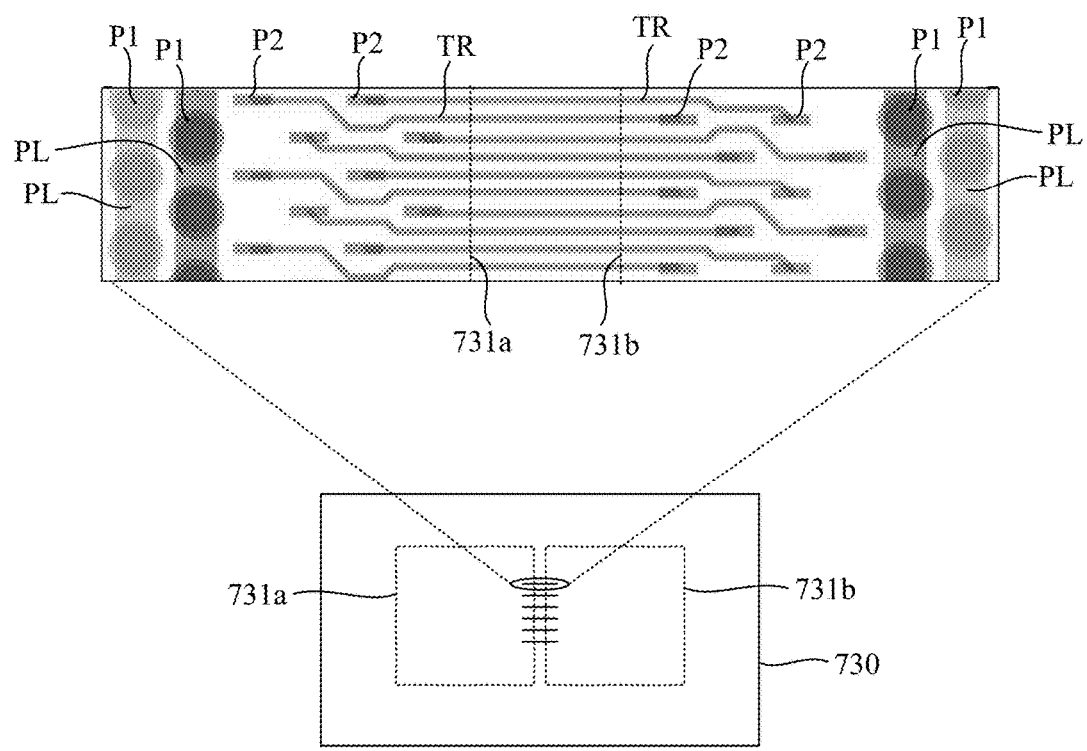
FIG. 9 illustrates a die to die microstrip escape configuration on a substrate, in accordance with certain embodiments.

FIG. 9 illustrates a die to die microstrip escape configuration, in accordance with certain embodiments. Microstrip escape routing extends along the surface of the substrate 730 from the first die shadow region 731a to the second die shadow region 731b. As seen in the blown up portion of FIG. 9, the microstrip escape pattern includes trace lines TR that extend from rectangular pads P2 in the first die shadow region 731a to rectangular pads P2 in the second die shadow region 731b of the substrate 730. Power lines PL having circular pads P1 are also illustrated in each of the die shadow regions 731a, 731b.

Figure 10A:
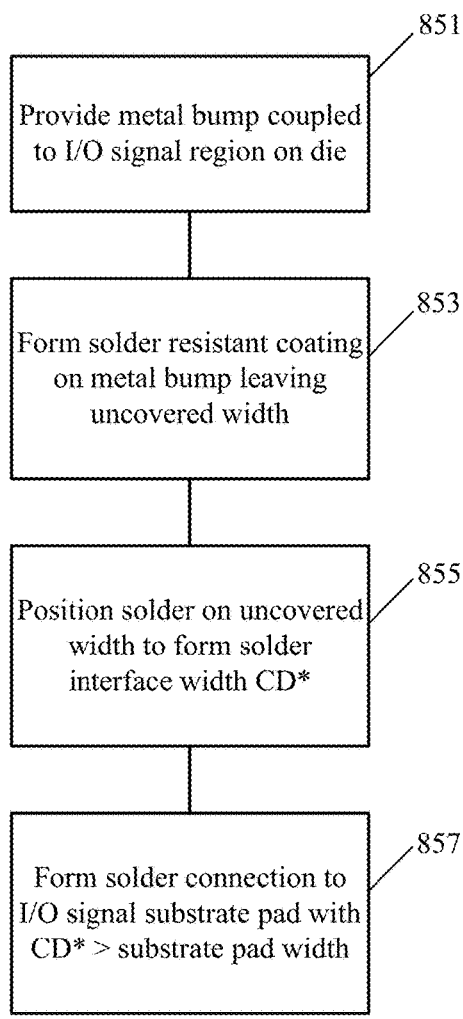
FIGS. 10A and 10B illustrate flowcharts of operations.

FIG. 10A illustrates a flowchart of operations relating to forming a solder connection between a die structure and a substrate in an I/O signal region, in accordance with certain embodiments. Box 851 is providing a metal bump electrically coupled to an I/O signal region on a die structure. The metal bump may be a Cu bump such as described above. Box 853 is forming a solder resistant coating on the bump such that a portion of the bump is covered by the coating and a portion of the bump is uncovered by the coating. The solder resistant coating may in certain embodiments be formed in accordance with the operations described above in connection with FIGS. 3A-3E. Box 855 is positioning solder on the bump in the portion uncovered by the solder, so that an interface of the solder and the bump defines a width CD*, such as described above in connection with FIG. 1. Box 857 is forming a solder connection to an I/O signal substrate pad so that the CD* is greater than the width of the substrate pad, to ensure a reliable solder joint is formed between the die structure and the substrate. The I/O signal substrate pad may have a relatively small width, for example, a rectangular pad having a width of about 13 µm.

Figure 10B:
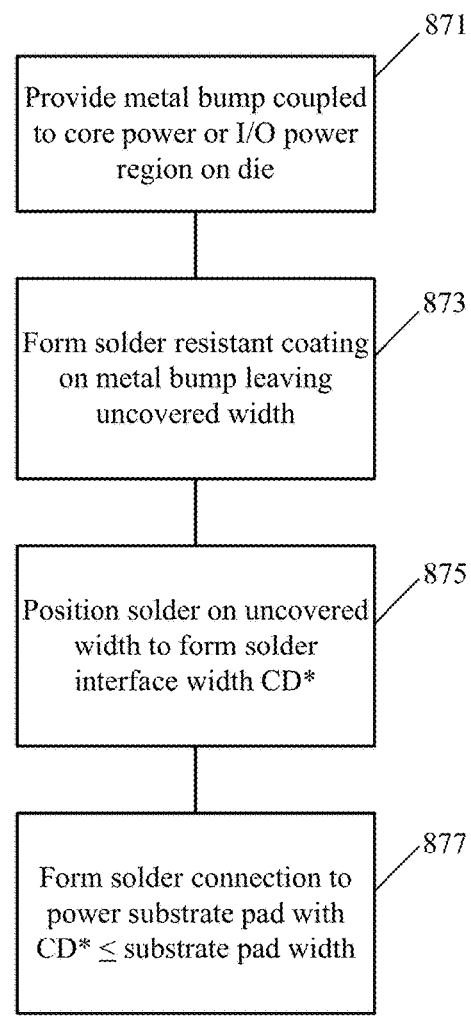

FIG. 10B illustrates a flowchart of operations relating to forming a solder connection between a die structure and a substrate, in a core power or I/O power region, in accordance with certain embodiments. Box 871 is providing a metal bump electrically coupled to a core power or I/O power region on a die structure. The metal bump may be a Cu bump such as described above. Box 873 is forming a solder resistant coating on the bump such that a portion of the bump is covered by the coating and a portion of the bump is uncovered by the coating. The solder resistant coating may in certain embodiments be formed in accordance with the operations described above in connection with FIGS. 3A-3E. Box 875 is positioning solder on the bump in the portion uncovered by the solder, so that an interface of the solder and the bump defines a width CD*, such as described above in connection with FIG. 2. Box 877 is forming a solder connection to a core power substrate pad or I/O power substrate pad so that the CD* is not greater than the width of the substrate pad, to ensure a reliable solder joint is formed between the die structure and the substrate. The core power or I/O power substrate pad may have a relatively large width, for example, a circular pad having a diameter of about 66 μm.

It should be appreciated that the operations in the flowcharts of FIGS. 10A and 10B may in certain embodiments be carried out simultaneously on a single assembly.

Embodiment permit the use of a variety of architectural configurations. For example, certain embodiments may utilize some I/O signal connections made on small rectangular pads, with other I/O connections made on larger circular shaped pads. Both I/O signal and power connections may be made on a variety of sized and shaped pads. Embodiments also permit variations in the size of the connections on the die structure, including, for example, different shaped and sized metal bumps and different CD* values for the solder connections.

Figure 11:
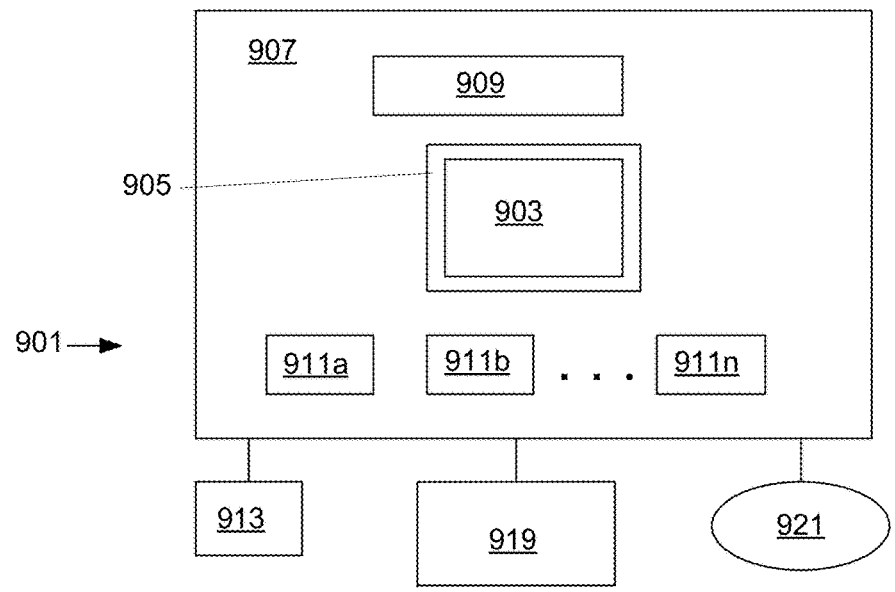
FIG. 11 illustrates an electronic system arrangement in which embodiments may find application.

Assemblies including structures formed as described in embodiments above may find application in a variety of electronic components. FIG. 11 schematically illustrates one example of an electronic system environment in which aspects of described embodiments may be embodied. Other embodiments need not include all of the features specified in FIG. 11, and may include alternative features not specified in FIG. 11.

The system 901 of FIG. 11 may include at least one central processing unit (CPU) 903. The CPU 903, also referred to as a microprocessor, may be a die attached to a package substrate 905, which is then coupled to a printed circuit board 907 (for example, a motherboard). The CPU 903 coupled to the package substrate is an example of an assembly that may be formed in accordance with embodiments such as described above. A variety of other system components, including, but not limited to memory and other components discussed below, may also include structures formed in accordance with embodiments such as described above.

The system 901 may further include memory 909 and one or more controllers 911a, 911b . . . 911n, which are also disposed on the motherboard 907. The motherboard 907 may be a single layer or multi-layered board which has a plurality of conductive lines that provide communication between the circuits in the package 905 and other components mounted to the board 907. Alternatively, one or more of the CPU 903, memory 909 and controllers 911a, 911b . . . 911n may be disposed on other cards such as daughter cards or expansion cards. The CPU 903, memory 909 and controllers 911a, 911b . . . 911n may each be seated in sockets or may be connected directly to a printed circuit board or all integrated in the same package. A display 919 may also be included.

Any suitable operating system and various applications execute on the CPU 903 and reside in the memory 909. The content residing in memory 909 may be cached in accordance with known caching techniques. Programs and data in memory 909 may be swapped into storage 913 as part of memory management operations. The system 901 may comprise any suitable computing device, including, but not limited to, a mainframe, server, personal computer, smart phone, workstation, laptop, handheld computer, netbook, tablet, book reader, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 911a, 911b . . . 911n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 913 in accordance with a storage protocol layer. The storage protocol of the layer may be any of a number of known storage protocols. Data being written to or read from the storage 913 may be cached in accordance with known caching techniques. A network controller can include one or more protocol layers to send and receive network packets to and from remote devices over a network 921. The network 921 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

Terms such as "first", "second", and the like may be used herein and do not necessarily denote any particular order, quantity, or importance, but are used to distinguish one element from another. Terms such as "top", "bottom", "upper", "lower", "overlying", and the like may be used for descriptive purposes only and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method for forming an interconnect between a die and a substrate, comprising:

providing a first metal bump electrically coupled to an I/O signal region on a die, the first metal bump defining a height, the first metal bump including a surface facing the substrate and a solder resistant coating that covers a first portion of the surface and leaves a second portion of the surface uncovered by the solder resist coating, the solder resistant coating extending outward from the surface a distance that is less than the height of the first metal bump;

providing a substrate having a first pad, the first pad having a pad width;

forming a solder connection between the first metal bump and the first pad, wherein the solder connection includes an interface between the solder connection and the second portion of the surface of the first metal bump, the interface having a width; and wherein the solder connection is controlled so that the width of the interface between the solder connection and the second portion of the surface is greater than the pad width of the first pad.

2. The method of claim 1, further comprising:

providing a second metal bump electrically coupled to a power region on the die, the second metal bump defining a height, the second metal bump including a surface facing the substrate and a solder resistant coating that covers a first portion of the surface of the second metal bump and leaves a second portion of the surface of the second metal bump uncovered by the solder resistant coating;

providing a second pad on the substrate, the second pad having a pad width;

forming a second solder connection between the second metal bump and the second pad, wherein the second solder connection includes an interface between the second solder connection and the second portion of the surface of the second metal bump, the interface having a width; and wherein the second solder connection is controlled so that the width of the interface between the second solder connection and the second portion of the surface of the second metal bump is no greater than the pad width of the second pad.

3. The method of claim 2, wherein the pad width of the first pad is smaller than the pad width of the second pad.

4. The method of claim 2, wherein the first pad is rectangular in shape and the second pad is circular in shape.

5. The method of claim 2, wherein the solder resistant coating that covers the first portion of the surface of the second metal bump and leaves the second portion of the surface of the second metal bump uncovered by the solder resist coating is formed by positioning the solder resistant coating to cover an outer portion of the surface of the second metal bump, while leaving a central portion of the surface of the second metal bump uncovered by the solder resist coating.

6. The method of claim 5, wherein the solder resistant coating that covers the first portion of the surface of the first metal bump and leaves the second portion of the surface of the first metal bump uncovered by the solder resist coating is formed by positioning the solder resistant coating to cover an outer portion of the surface of the metal bump, while leaving a central portion of the surface of the first metal bump uncovered by the solder resistant coating.

7. The method of claim 1, wherein the solder resistant coating that covers the first portion of the surface and leaves the second portion of the surface uncovered by the solder resist coating is formed by positioning the solder resistant coating to cover an outer portion of the surface and leaving a central portion of the surface uncovered by the solder resist coating.

8. A method comprising:

providing a first metal bump electrically coupled to an I/O signal region on a die;

providing a second metal bump electrically coupled to a power region on the die;

providing a substrate having a first pad and a second pad, the first pad having a first pad width, the second pad having a second pad width;

forming a first solder connection between the first metal bump and the first pad, wherein the first solder connection includes an interface between the first solder connection and the first metal bump that is greater than a width of the first pad; and forming a second solder connection between the second metal bump and the second pad, wherein the second solder connection includes an interface between the second solder connection and the second metal bump that is no greater than a width of the second pad.

9. The method of claim 8, comprising positioning a solder resistant coating to cover an outer portion of a surface of the first metal bump and to cover sidewalls of the first metal bump, while leaving a central portion of the surface of the first metal bump uncovered by the solder resistant coating;

wherein the interface between the first solder connection and the first metal bump is formed at the central portion of the surface of the first metal bump.

10. The method of claim 8, comprising positioning a solder resistant coating to cover an outer portion of a surface of the second metal bump and to cover sidewalls of the second metal bump, while leaving a central portion of the surface of the second metal bump uncovered by the solder resistant coating;

wherein the interface between the second solder connection and the second metal bump is formed at the central portion of the surface of the second metal bump.

11. The method of claim 8, comprising positioning on each of the first and second metal bumps a solder resistant coating to cover an outer portion of a surface and to cover sidewalls, while leaving a central portion of the surface uncovered by the solder resistant coating;

wherein the interface between the first solder connection and the first metal bump is formed at the central portion of the surface of the first metal bump; and wherein the interface between the second solder connection and the second metal bump is formed at the central portion of the surface of the second metal bump.

12. The method of claim 8, wherein the first pad is rectangular in shape.

13. The method of claim 8, wherein the second pad is circular in shape.

14. The method of claim 8, wherein the first pad is rectangular in shape and the second pad is circular in shape.

15. The method of claim 8, wherein the width of the first pad is smaller than the width of the second pad.

16. The method of claim 11, wherein the surface is parallel to a surface of the first pad and to a surface of the second pad.

17. The method of claim 8, further comprising positioning a solder resistant coating to cover an outer portion of a surface of the first metal bump, while leaving a central portion of the surface of the first metal bump uncovered by the solder resistant coating;

wherein the interface between the first solder connection and the first metal bump is formed at the central portion of the surface of the first metal bump;
the first metal bump including a sidewall extending from the surface towards the die; and
wherein the solder resistant coating is positioned to extend continuously from the outer portion of the surface up the sidewall towards the die.

18. A method comprising:
providing a first metal bump electrically coupled to an I/O signal region on a die, the first metal bump including side and bottom surfaces, the first metal bump defining a height,
positioning a solder resistant coating to cover a first portion of the bottom surface of the first metal bump and to leave a second portion of the bottom surface of the first metal bump uncovered by the solder resistant coating, the solder resistant coating further positioned to extend outward from the bottom surface a distance that is less than the height of the first metal bump;
providing a second metal bump electrically coupled to a power region on a die, the second metal bump including side and bottom surfaces, the second metal bump defining a height; and
positioning a solder resistant coating to cover a first portion of the bottom surface of the second metal bump and to leave a second portion of the bottom surface of the second metal bump uncovered by the solder resistant coating, the solder resistant coating further positioned to extend outward from the bottom surface of the second metal bump a distance that is less than the height of the second metal bump.

19. The method of claim 18, further comprising:
forming a solder connection between the first metal bump and a first pad on a substrate, including an interface between the solder connection and the second portion of the first metal bump, the interface having a width that is greater than a pad width of the first pad; and
forming a solder connection between the second metal bump and a second pad on the substrate, including an interface between the solder connection and the second portion of the second metal bump, the interface having a width that is no greater than a pad width of the second pad.

20. The method of claim 16, wherein the first pad is rectangular in shape and the second pad is circular in shape.

* * * * *